United States Patent
Takagimoto et al.

(10) Patent No.: US 10,360,969 B2
(45) Date of Patent: Jul. 23, 2019

(54) LIGHT EMITTING ELEMENT DRIVING SEMICONDUCTOR INTEGRATED CIRCUIT, LIGHT EMITTING ELEMENT DRIVING DEVICE, LIGHT EMITTING DEVICE, AND VEHICLE

(71) Applicant: Rohm Co., Ltd., Kyoto (JP)

(72) Inventors: Shinsuke Takagimoto, Kyoto (JP); Yoshiyuki Nakatani, Kyoto (JP); Masaaki Nakayama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 22 days.

(21) Appl. No.: 15/594,816

(22) Filed: May 15, 2017

(65) Prior Publication Data
US 2017/0337963 A1    Nov. 23, 2017

(30) Foreign Application Priority Data
May 17, 2016  (JP) .................. 2016-098858

(51) Int. Cl.
*G11C 11/4063*    (2006.01)
*G01R 31/02*    (2006.01)
(Continued)

(52) U.S. Cl.
CPC .......... *G11C 11/4063* (2013.01); *G01R 31/02* (2013.01); *G01R 31/2836* (2013.01);
(Continued)

(58) Field of Classification Search
CPC .............. G11C 11/4063; G01R 31/02; G01R 31/2836; H04B 10/40; H04B 10/502;
(Continued)

(56) References Cited

U.S. PATENT DOCUMENTS

| | | | |
|---|---|---|---|
| 2007/0159118 A1* | 7/2007 | Kajita | ................ H05B 33/0815 315/312 |
| 2012/0050697 A1 | 3/2012 | Suzuki | |
| 2015/0102726 A1 | 4/2015 | Yoneoka et al. | |

FOREIGN PATENT DOCUMENTS

| | | |
|---|---|---|
| EP | 2675247 | 12/2013 |
| JP | 2012231181 | 11/2012 |

(Continued)

OTHER PUBLICATIONS

European Patent Office, Office Action in EP application No. 17170993.4-1204 (dated Jul. 9, 2018).

(Continued)

*Primary Examiner* — Tomi Skibinski
(74) *Attorney, Agent, or Firm* — Fish & Richardson P.C.

(57) ABSTRACT

A light emitting element driving semiconductor integrated circuit constitutes at least a part of a light emitting element driving device arranged to drive a series connection unit including a plurality of light emitting elements. The light emitting element driving semiconductor integrated circuit includes a single-element short-circuit detection unit arranged to detect that one of the plurality of light emitting elements is short-circuited, and a control unit arranged to control a power element of the light emitting element driving device so that current supplied from the light emitting element driving device to the series connection unit is increased, when the single-element short-circuit detection circuit detects that one of the plurality of light emitting elements is short-circuited.

13 Claims, 8 Drawing Sheets

(51) Int. Cl.
| | |
|---|---|
| *G01R 31/28* | (2006.01) |
| *H03K 19/173* | (2006.01) |
| *H04B 10/40* | (2013.01) |
| *H04B 10/50* | (2013.01) |
| *H04B 10/54* | (2013.01) |
| *H05B 33/08* | (2006.01) |

(52) U.S. Cl.
CPC ........... *H03K 19/173* (2013.01); *H04B 10/40* (2013.01); *H04B 10/502* (2013.01); *H04B 10/54* (2013.01); *H05B 33/089* (2013.01); *H05B 33/0884* (2013.01); *H05B 33/083* (2013.01); *H05B 33/0848* (2013.01)

(58) Field of Classification Search
CPC .. H04B 10/54; H05B 33/0884; H05B 33/089; H05B 33/083; H05B 33/0848
USPC ............................................ 327/516; 315/82
See application file for complete search history.

(56) References Cited

FOREIGN PATENT DOCUMENTS

| JP | 2015-079566 | 4/2015 |
|---|---|---|
| WO | 2015/145742 | 10/2015 |

OTHER PUBLICATIONS

European Patent Office; Partial European Search Report dated Sep. 20, 2017 in corresponding European Patent Application No. 17170993.4.

* cited by examiner

LIGHT EMITTING ELEMENT DRIVING SEMICONDUCTOR INTEGRATED CIRCUIT, LIGHT EMITTING ELEMENT DRIVING DEVICE, LIGHT EMITTING DEVICE, AND VEHICLE

CROSS-REFERENCE TO RELATED APPLICATIONS

This nonprovisional application claims priority under 35 U.S.C. § 119(a) on Patent Application No. 2016-098858 filed in Japan on May 17, 2016, the entire contents of which are hereby incorporated by reference.

BACKGROUND OF THE INVENTION

Field of the Invention

The present invention relates to a light emitting element driving semiconductor integrated circuit. In addition, the present invention relates to a light emitting element driving device, and a light emitting device and a vehicle each using the same.

Description of Related Art

Figure 10:
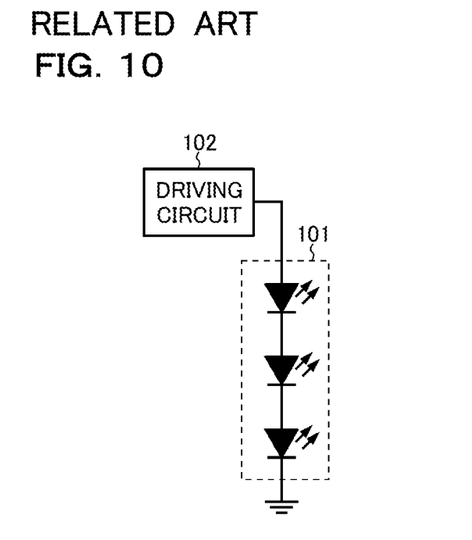
FIG. 10 is a diagram illustrating a general structural example of a light emitting device that lights a plurality of light emitting elements.
Figure 11:
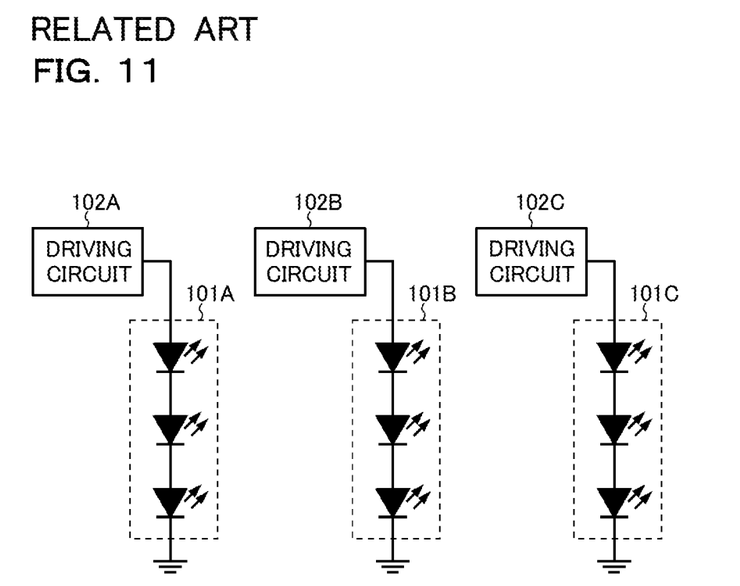
FIG. 11 is a diagram illustrating another general structural example of the light emitting device that lights a plurality of light emitting elements.

There are general structural examples of a light emitting device that lights a plurality of light emitting elements as illustrated in FIGS. 10 and 11.

The light emitting device illustrated in FIG. 10 includes a plurality of light emitting diodes 101, and a driving circuit 102 that drives the plurality of light emitting diodes 101.

The light emitting device illustrated in FIG. 11 includes at least one light emitting diode 101A belonging to a first system, a driving circuit 102A that drives the at least one light emitting diode 101A, at least one light emitting diode 101B belonging to a second system, a driving circuit 102B that drives the at least one light emitting diode 101B, at least one light emitting diode 101C belonging to a third system, and a driving circuit 102C that drives the at least one light emitting diode 101C.

The plurality of light emitting diodes 101 disposed in the light emitting device illustrated in FIG. 10 have different life periods due to production tolerance or the like. Therefore, when life of a light emitting diode having the shortest life period ends due to occurrence of a short-circuit abnormality, remaining light emitting diodes that are still alive are driven (lighted) by current output from the driving circuit 102. However, because the number of lighted light emitting diodes is decreased by one in this lighted state, the luminance is insufficient so that sufficient luminance for securing safety may not be obtained.

The light emitting device illustrated in FIG. 11 has the three systems. Therefore, even if the number of lighted light emitting diodes is decreased in one of the three systems, light emitting diodes in remaining two systems are normally lighted. However, because the number of lighted light emitting diodes is decreased in this lighted state, the luminance is insufficient so that sufficient luminance for securing safety may not be obtained.

Figure 12:
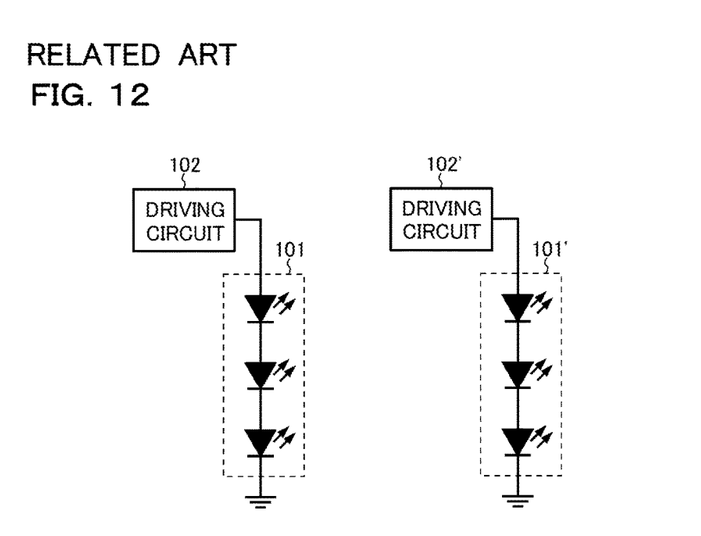
FIG. 12 is a diagram illustrating a structure in which backup components are added to the light emitting device illustrated in FIG. 10.
Figure 13:
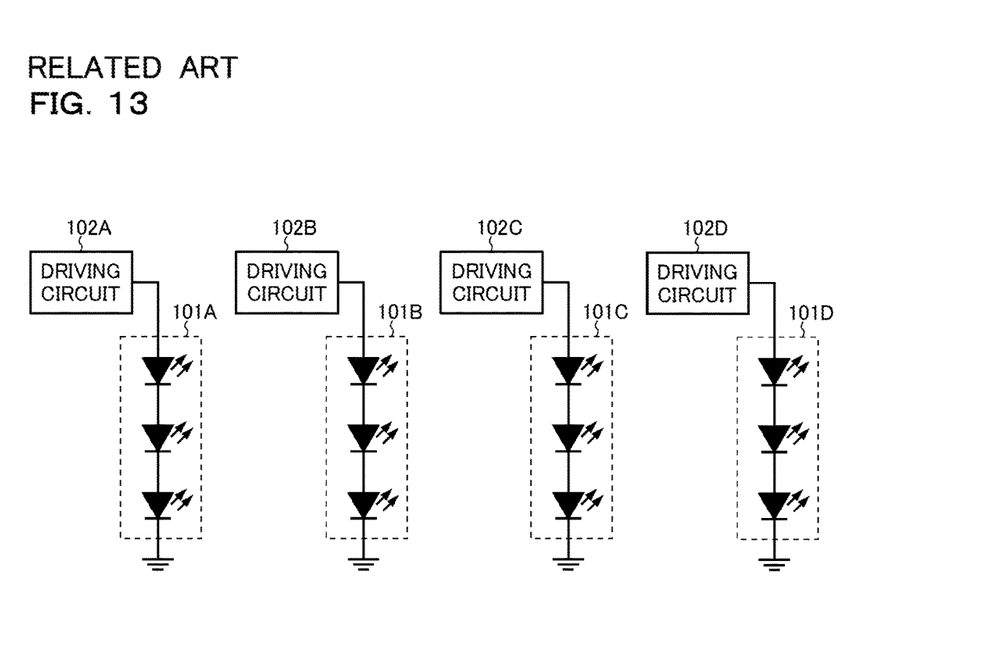
FIG. 13 is a diagram illustrating a structure in which backup components are added to the light emitting device illustrated in FIG. 11.

Therefore, it is possible to adopt the structure illustrated in FIG. 12 as a countermeasure against the above, in which a plurality of light emitting diodes 101' and a driving circuit 102' that drives the plurality of light emitting diodes 101' are added as a backup to the light emitting device illustrated in FIG. 10, and the light emitting diode and the driving circuit to be used are switched to the backup when the number of lighted light emitting diodes 101 is decreased. Similarly, it is possible to adopt the structure illustrated in FIG. 13, in which at least one light emitting diode 101D and a driving circuit 102D that drives the at least one light emitting diode 101D are added as a backup to the light emitting device illustrated in FIG. 11, and when the number of lighted light emitting diodes in one circuit is decreased, the backup is used instead of the one circuit.

However, there is a problem that the structure illustrated in FIG. 12 causes more number of components than the structure illustrated in FIG. 10, and hence power consumption and cost are increased. Similarly, there is a problem that the structure illustrated in FIG. 13 causes more number of components than the structure illustrated in FIG. 11, and hence power consumption and cost are increased.

Note that JP-A-2015-79566 proposes a light source control device that can provide appropriate luminance even if a short-circuit breakdown occurs in one of light sources. However, the light source control device proposed in JP-A-2015-79566 controls the plurality of light sources that are connected in parallel, and uses a switch to cut off current supply to the light emitting diode that is short-circuited and broken, so that the light emitting diodes that are not short-circuited can be prevented from being turned off. The light emitting device illustrated in FIG. 10 and the light emitting device illustrated in FIG. 11 do not have the structure in which the light emitting diodes are connected in parallel. Therefore, even if the above-mentioned technique proposed in JP-A-2015-79566 is applied to the light emitting device illustrated in FIG. 10 and the light emitting device illustrated in FIG. 11, occurrence of insufficient luminance due to a decrease in the number of lighted light emitting diodes cannot be prevented.

SUMMARY OF THE INVENTION

It is an object of the present invention to provide a light emitting element driving semiconductor integrated circuit that can suppress occurrence of insufficient luminance when a plurality of light emitting elements are partially broken down so that the number of lighted light emitting elements is decreased. In addition, in view of the situation described above, it is an object of the present invention to provide a light emitting element driving device, and a light emitting device and a vehicle each using the light emitting element driving device, which can prevent occurrence of insufficient luminance when a plurality of light emitting elements are partially broken down so that the number of lighted light emitting elements is decreased.

An example of the light emitting element driving semiconductor integrated circuit disclosed in this specification, which constitutes at least a part of a light emitting element driving device arranged to drive a series connection unit including a plurality of light emitting elements, includes a single-element short-circuit detection unit arranged to detect that one of the plurality of light emitting elements is short-circuited, and a control unit arranged to control a power element of the light emitting element driving device so that current supplied from the light emitting element driving device to the series connection unit is increased, when the single-element short-circuit detection unit detects that one of the plurality of light emitting elements is short-circuited.

Another example of the light emitting element driving semiconductor integrated circuit disclosed in this specification, which constitutes at least a part of a light emitting element driving device arranged to drive at least one light emitting element, includes a determining unit arranged to determine whether or not luminance of the at least one light emitting element is decreased due to a decrease in the number of lighted elements in the at least one light emitting element, a transmitting unit arranged to transmit a notification signal to another light emitting element driving semiconductor integrated circuit, when the determining unit determines that luminance of the at least one light emitting element is decreased due to a decrease in the number of lighted elements in the at least one light emitting element, a receiving unit arranged to receive another notification signal transmitted from another light emitting element driving semiconductor integrated circuit, and a control unit arranged to control a power element of the light emitting element driving device. When the determining unit determines that luminance of the at least one light emitting element is decreased due to a decrease in the number of lighted elements in the at least one light emitting element, the control unit controls the power element to stop current supply from the light emitting element driving device to the at least one light emitting element. When the receiving unit receives the another notification signal, the control unit controls the power element so that current supplied from the light emitting element driving device to the at least one light emitting element is increased.

Still another example of the light emitting element driving semiconductor integrated circuit disclosed in this specification, which constitutes at least a part of a light emitting element driving device arranged to supply respective currents to a plurality of systems each including at least one light emitting element, includes a determining unit arranged to determine whether or not luminance of one system is decreased due to a decrease in the number of lighted elements in the one system, and a control unit arranged to control a plurality of power elements of the light emitting element driving device. When the determining unit determines that luminance of the one system is decreased due to a decrease in the number of lighted elements in the one system, the control unit controls the power element corresponding to the one system to stop current supply from the light emitting element driving device to the one system, and controls at least one power element corresponding to a system other than the one system so that current supplied from the light emitting element driving device to the system other than the one system is increased.

An example of the light emitting element driving device disclosed in this specification, which drives a series connection unit including a plurality of light emitting elements, includes a power element, a single-element short-circuit detection unit arranged to detect that one of the plurality of light emitting elements is short-circuited, and a control unit arranged to control the power element so that current supplied from the light emitting element driving device to the series connection unit is increased, when the single-element short-circuit detection unit detects that one of the plurality of light emitting elements is short-circuited.

Another example of the light emitting element driving device disclosed in this specification, which supplies respective currents to a plurality of systems each including at least one light emitting element, includes a plurality of power elements, a determining unit arranged to determine whether or not luminance of one system is decreased due to a decrease in the number of lighted elements in the one system, and a control unit arranged to control the plurality of power elements. When the determining unit determines that luminance of the one system is decreased due to a decrease in the number of lighted elements in the one system, the control unit controls the power element corresponding to the one system to stop current supply from the light emitting element driving device to the one system, and controls at least one power element corresponding to a system other than the one system so that current supplied from the light emitting element driving device to the system other than the one system is increased.

A light emitting device disclosed in this specification includes a plurality of light emitting elements, and the light emitting element driving device according to any one of the structures described above arranged to drive the plurality of light emitting elements.

A vehicle disclosed in this specification includes the light emitting device having the structure described above.

The meanings and effects of the present invention will become more apparent from the description of an embodiment given below. However, the embodiment described below is merely an embodiment of the present invention, and meanings of the present invention and terms of structural components are not limited to those described in the following embodiment.

DETAILED DESCRIPTION OF THE PREFERRED EMBODIMENTS

First Structural Example

Figure 1:
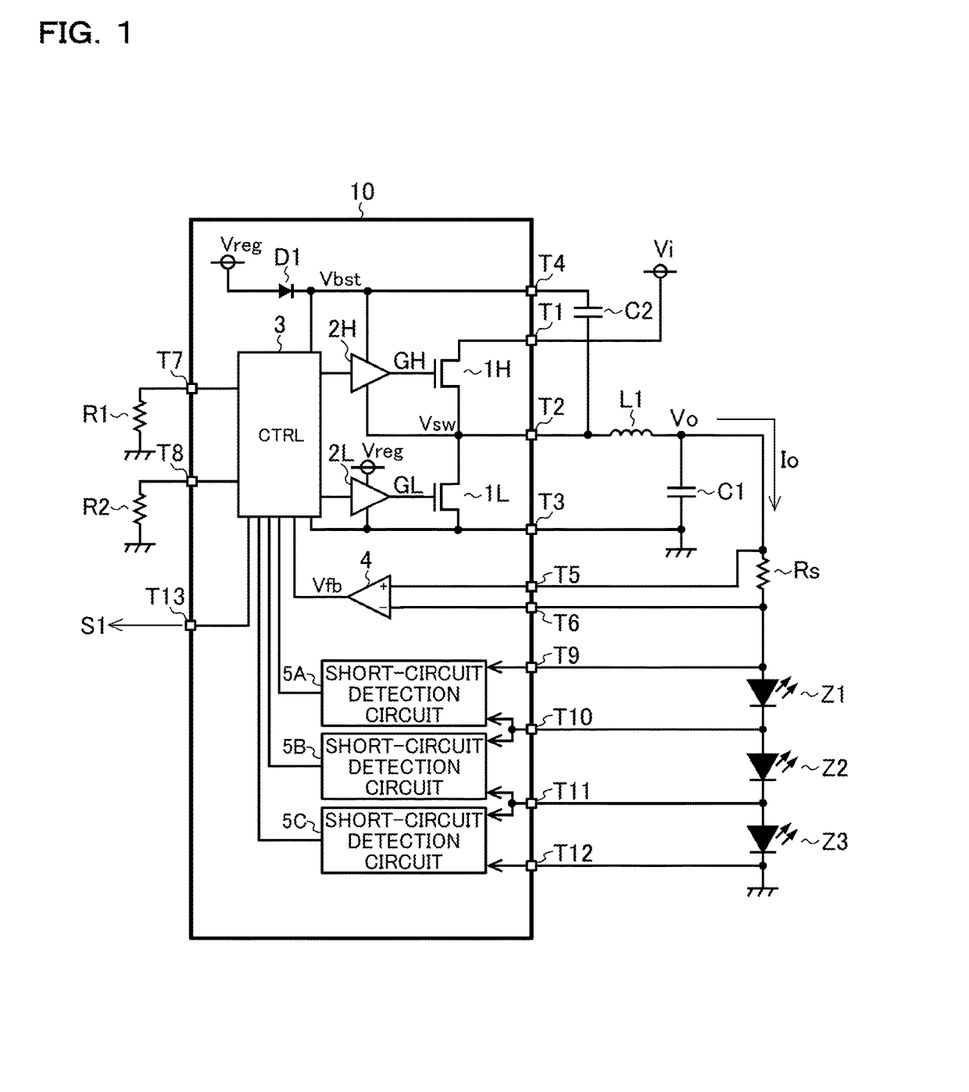
FIG. 1 is a diagram illustrating a first structural example of a light emitting device.

FIG. 1 is a diagram illustrating a first structural example of a light emitting device. The light emitting device illustrated in FIG. 1 is equipped with a light emitting element driving device including a light emitting element driving IC 10, a coil L1, an output capacitor C1, a sense resistor Rs, and a capacitor C2. In addition, the light emitting device illustrated in FIG. 1 includes light emitting diodes Z1 to Z3 to be driven by the light emitting element driving device. Note that, in the structural example of FIG. 1, the number of the light emitting diodes and the number of short-circuit detection circuits disposed in the light emitting element driving IC 10 are each three, but the number may be two or more without limiting to three.

The light emitting element driving IC 10 is a semiconductor integrated circuit device (so-called LED driver IC), in which N-channel MOS field-effect transistors 1H and 1L (hereinafter referred to as an upper transistor 1H and a lower transistor 1L), an upper driver 2H and a lower driver 2L, a diode D1, a control unit 3, an amplifier 4, and short-circuit detection circuits 5A to 5C are integrated. In addition, the light emitting element driving IC 10 has external terminals T1 to T13 arranged to establish external electrical connections.

Outside the light emitting element driving IC 10, the external terminal T1 is connected to an application terminal of an input voltage Vi. The external terminal T2 is connected to a first terminal of the coil L1. A second terminal of the coil L1 (application terminal of an output voltage Vo) is connected to a first terminal of the sense resistor Rs. A second terminal of the sense resistor Rs is connected to the anode of a series connection unit including the light emitting diodes Z1 to Z3. The cathode of the series connection unit including the light emitting diodes Z1 to Z3 is connected to a ground terminal. A first terminal of the output capacitor C1 is connected to the second terminal of the coil L1. A second terminal of the output capacitor C1 is connected to the ground terminal. The external terminal T3 is connected to the ground terminal. The external terminal T4 is connected to the first terminal of the coil L1 via the capacitor C2. The external terminal T5 is connected to the first terminal of the sense resistor Rs. The external terminal T6 is connected to the second terminal of the sense resistor Rs. The external terminal T7 is connected to the ground terminal via a resistor R1. The external terminal T8 is connected to the ground terminal via a resistor R2. The external terminal T9 is connected to the anode of the light emitting diode Z1. The external terminal T10 is connected to the cathode of the light emitting diode Z1 and the anode of the light emitting diode Z2. The external terminal T11 is connected to the cathode of the light emitting diode Z2 and the anode of the light emitting diode Z3. The external terminal T12 is connected to the cathode of the light emitting diode Z3.

Inside the light emitting element driving IC 10, the drain of the upper transistor 1H is connected to the external terminal T1. The source of the upper transistor 1H is connected to the external terminal T2. The gate of the upper transistor 1H is connected to the output terminal of the upper driver 2H. The drain of the lower transistor 1L is connected to the external terminal T2. The source of the lower transistor 1L is connected to the external terminal T3. The gate of the lower transistor 1L is connected to the output terminal of the lower driver 2L. In other words, the upper transistor 1H and the lower transistor 1L are connected in series between an application terminal of the input voltage Vi and the ground terminal, and the connection node therebetween (application terminal of a switch voltage Vsw) is connected to the output capacitor C1 via the coil L1.

The upper driver 2H generates a control signal GH for the upper transistor 1H based on an instruction from the control unit 3. The upper transistor 1H is turned on when the control signal GH is high level, and it is turned off when the control signal GH is low level. The lower driver 2L generates a control signal GL for the lower transistor 1L based on an instruction from the control unit 3. The lower transistor 1L is turned on when the control signal GL is high level, and it is turned off when the control signal GL is low level.

The diode D1 and the capacitor C2 externally connected to the light emitting element driving IC 10 constitute a bootstrap circuit. The bootstrap circuit generates a boost voltage Vbst. The anode of the diode D1 is connected to an application terminal of a constant voltage Vreg. The cathode of the diode D1 is connected to the external terminal T4.

A first power supply terminal of the upper driver 2H and a first power supply terminal of the control unit 3 are connected to the external terminal T4 (application terminal of the boost voltage Vbst). A second power supply terminal of the upper driver 2H is connected to the external terminal T2 (application terminal of the switch voltage Vsw). Therefore, high level of the control signal GH applied to the gate of the upper transistor 1H is the boost voltage Vbst, and low level of the control signal GH is the switch voltage Vsw.

A first power supply terminal of the lower driver 2L is connected to the application terminal of the constant voltage Vreg. A second power supply terminal of the lower driver 2L is connected to the external terminal T3 (application terminal of the ground voltage GND). Therefore, high level of the control signal GL applied to the gate of the lower transistor 1L is the constant voltage Vreg, and low level of the control signal GL is the ground voltage GND.

An operation of the bootstrap circuit having the structure described above is described. When the upper transistor 1H is turned off while the lower transistor 1L is turned on so that the switch voltage Vsw is low level (GND), current flows from the application terminal of the constant voltage Vreg to the capacitor C2 via the diode D1 so as to charge the capacitor C2. In this case, the boost voltage Vbst is substantially the constant voltage Vreg (more correctly a value (Vreg−Vf) obtained by subtracting a forward drop voltage Vf of the diode D1 from the constant voltage Vreg).

On the other hand, when the upper transistor 1H is turned on while the lower transistor 1L is turned off in the state where the capacitor C2 is charged so that the switch voltage Vsw is increased from low level (GND) to high level (Vi), the boost voltage Vbst is increased to a value (Vi+Vreg) higher than high level (Vi) of the switch voltage Vsw by the charge voltage of the capacitor C2 (substantially Vreg). Because this boost voltage Vbst is applied to the first power supply terminal of the upper driver 2H, the upper transistor 1H can be securely driven to be turned on and off.

The control unit 3 generates a PWM signal inside and drives the upper driver 2H and the lower driver 2L so as to turn on and off the upper transistor 1H and the lower transistor 1L in accordance with a feedback voltage Vfb in an on period (high level period) of the PWM signal. On the other hand, the control unit 3 drives the upper driver 2H and the lower driver 2L so as to stop generation of the output voltage Vo in an off period (low level period) of the PWM signal.

The amplifier 4 amplifies a voltage applied between a noninverting input terminal (+) and an inverting input terminal (−), which is a voltage across both ends of the sense resistor Rs, so as to generate the feedback voltage Vfb. Therefore, the feedback voltage Vfb is a voltage signal that increases or decreases in accordance with an output current Io flowing in the sense resistor Rs.

Note that the upper transistor 1H, the lower transistor 1L, the upper driver 2H, the lower driver 2L, the control unit 3, and the amplifier 4 constitute an output voltage generating unit, which generates the output voltage Vo from the input voltage Vi so that the output current Io flowing in the light emitting diodes Z1 to Z3 coincides with a target value in the on period of the PWM signal generated by the control unit 3, and stops the generation of the output voltage Vo in the off period of the PWM signal generated by the control unit 3.

The short-circuit detection circuit 5A checks whether or not an anode-cathode voltage of the light emitting diode Z1 (voltage between the external terminal T9 and the external terminal T10) is substantially zero. If it is substantially zero, a short-circuit of the light emitting diode Z1 is detected, and a low level signal is output. If a short-circuit of the light emitting diode Z1 is not detected, a high level signal is output. The short-circuit detection circuit 5B detects a short-circuit of the light emitting diode Z2 in the same manner, and the short-circuit detection circuit 5C detects a short-circuit of the light emitting diode Z3 in the same manner.

If none of the short-circuit detection circuits 5A to 5C detects a short-circuit of the light emitting diode, i.e., if all the short-circuit detection circuits 5A to 5C output the high level signal, the control unit 3 generates the PWM signal having an on-duty corresponding to a resistance value of the resistor R1 connected to the external terminal T7. On the other hand, if one of the short-circuit detection circuits 5A to 5C detects a short-circuit of the light emitting diode, i.e., if one of the short-circuit detection circuits 5A to 5C outputs the low level signal while other two short-circuit detection circuits output the high level signal, the control unit 3 generates the PWM signal having an on-duty corresponding to a resistance value of the resistor R2 connected to the external terminal T8. The on-duty corresponding to the resistance value of the resistor R2 is set to a larger value than the on-duty corresponding to the resistance value of the resistor R1.

In addition, if one of the short-circuit detection circuits 5A to 5C detects a short-circuit of the light emitting diode, i.e., if one of the short-circuit detection circuits 5A to 5C outputs the low level signal while other two short-circuit detection circuits output the high level signal, the control unit 3 outputs to the external terminal T13 an abnormality notification signal S1 indicating that there is an unlighted light emitting diode.

According to the light emitting device illustrated in FIG. 1 described above, when life of a light emitting diode having the shortest life period among the light emitting diodes Z1 to Z3 ends due to occurrence of a short-circuit abnormality, current flowing in the remaining two light emitting diodes that are still alive becomes larger than usual based on the PWM signal having a larger on-duty. Thus, even if the number of lighted light emitting diodes is decreased by one, insufficient luminance can be prevented.

In addition, because the light emitting device illustrated in FIG. 1 can prevent insufficient luminance even if the number of lighted light emitting diodes is decreased by one, a user hardly notices that one light emitting diode is short-circuited. However, because the light emitting device illustrated in FIG. 1 outputs the abnormality notification signal S1 externally from the external terminal T13 when one light emitting diode is short-circuited, it is possible to readily urge the user to have the light emitting device illustrated in FIG. 1 repaired, by using the abnormality notification signal S1.

In addition, it is possible to adopt the following structure different from the above-described structure. If none of the short-circuit detection circuits 5A to 5C detects a short-circuit of the light emitting diode, the control unit 3 sets a target value of the output current Io corresponding to the resistance value of the resistor R1 connected to the external terminal T7. On the other hand, if one of the short-circuit detection circuits 5A to 5C detects a short-circuit of the light emitting diode, the control unit 3 sets a target value of the output current Io corresponding to the resistance value of the resistor R2 connected to the external terminal T8. The target value of the output current Io corresponding to the resistance value of the resistor R2 is set to a larger value than the target value of the output current Io corresponding to the resistance value of the resistor R1. With this structure, even if the number of lighted light emitting diodes is decreased by one, insufficient luminance can be prevented. Note that this structure is particularly preferred when the on-duty of the PWM signal generated by the control unit 3 is close to 100% in a normal state (where a short-circuit does not occur in the light emitting diode).

Further, it is possible to combine the structure described above and the variation described above to make the following structure. If none of the short-circuit detection circuits 5A to 5C detects a short-circuit of the light emitting diode, the control unit 3 generates the PWM signal having the on-duty corresponding to the resistance value of the resistor R1 connected to the external terminal T7, and sets a target value of the output current Io corresponding to the resistance value of a current setting resistor connected to a current setting external terminal provided additionally. On the other hand, if one of the short-circuit detection circuits 5A to 5C detects a short-circuit of the light emitting diode, the control unit 3 generates the PWM signal having the on-duty corresponding to the resistance value of the resistor R2 connected to the external terminal T8, and sets a target value of the output current Io corresponding to the resistance value of another current setting resistor connected to another current setting external terminal provided additionally.

Second Structural Example

Figure 2:
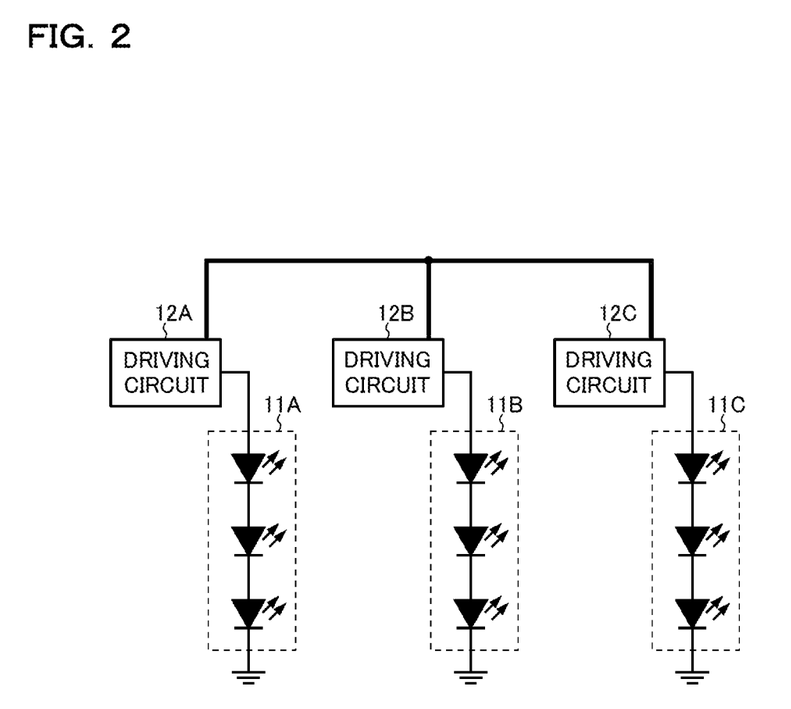
FIG. 2 is a diagram illustrating a second structural example of the light emitting device.

FIG. 2 is a diagram illustrating a second structural example of the light emitting device. The light emitting device illustrated in FIG. 2 include at least one light emitting diode 11A belonging to a first system, a driving circuit 12A that drives the at least one light emitting diode 11A, at least one light emitting diode 11B belonging to a second system, a driving circuit 12B that drives the at least one light emitting diode 11B, at least one light emitting diode 11C belonging to a third system, and a driving circuit 12C that drives the at least one light emitting diode 11C. The driving circuits 12A to 12C have a structure enabling mutual communication with each other.

Figure 3:
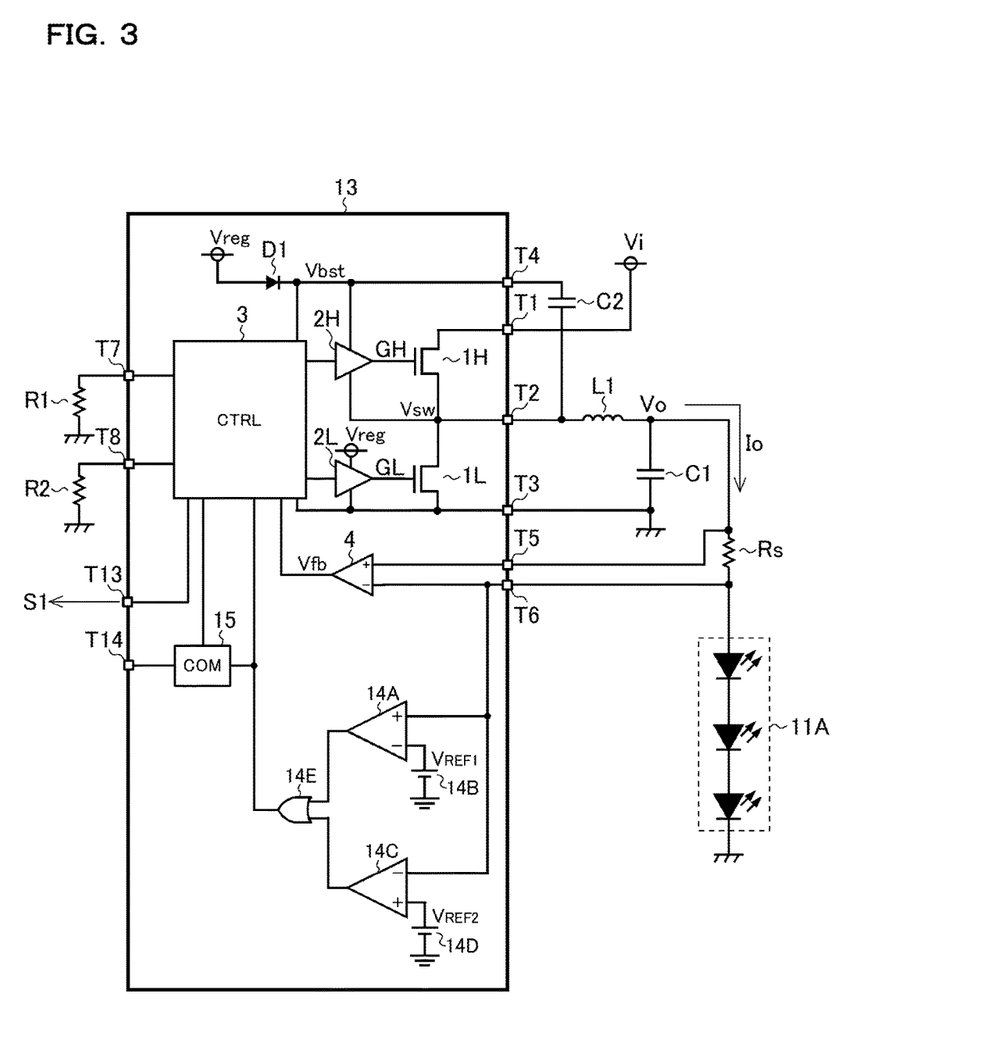
FIG. 3 is a diagram illustrating one structural example of a driving circuit.

The driving circuits 12A to 12C have the same structure, and hence a structural example of the driving circuit 12A is described as a typical one among the driving circuits 12A to 12C. FIG. 3 is a diagram illustrating one structural example of the driving circuit 12A. Note that at least one light emitting diode 11A connected to the driving circuit 12A is also shown in FIG. 3. In addition, in FIG. 3, the same part as in FIG. 1 is denoted by the same numeral, and detailed description thereof is omitted.

The driving circuit 12A as the structural example illustrated in FIG. 3 is constituted of a light emitting element driving IC 13 and external components. The light emitting element driving IC 13 includes a determining unit constituted of comparators 14A and 14C, reference voltage sources 14B and 14D, and an OR gate 14E. In addition, the light emitting element driving IC 13 includes a communication unit 15.

The comparator 14A compares a voltage of the external terminal T6 with a first reference voltage $V_{REF1}$ output from the reference voltage source 14B, and outputs a high level signal if the voltage of the external terminal T6 is equal to or higher than the first reference voltage $V_{REF1}$. The comparator 14C compares the voltage of the external terminal T6 with a second reference voltage $V_{REF2}$ (lower than the first reference voltage $V_{REF1}$) output from the reference voltage source 14D, and outputs a high level signal if the voltage of the external terminal T6 is lower than the second reference voltage $V_{REF2}$. When at least one of output signals of the comparators 14A and 14C is high level, the OR gate 14E outputs a high level signal to the control unit 3 and the communication unit 15.

The first reference voltage $V_{REF1}$ is set to a value higher than a total forward voltage of the light emitting diode 11A, for example, which is a threshold value for determining whether or not there is a malfunction that the light emitting diode 11A is not lighted because of a breakage. The second reference voltage $V_{REF2}$ is set to a value lower than a forward voltage of one element in the light emitting diode 11A, for example, which is a threshold value for determining whether or not there is a malfunction that the light emitting diode 11A is not lighted because of a ground fault. Thus, the determining unit can determine whether or not luminance of the light emitting diode 11A is decreased due to a decrease in the number of lighted elements in the light emitting diode 11A. If the determining unit determines that luminance of the light emitting diode 11A is decreased due to a decrease in the number of lighted elements in the light emitting diode 11A, it outputs a high level signal.

When receiving the high level signal from the OR gate 14E, the communication unit 15 outputs a notification signal to an external terminal T14, so as to supply the notification signal to the external terminals T14 of the other light emitting element driving ICs connected to the external terminal T14 of the light emitting element driving IC 13 (the light emitting element driving IC constituting a part of the driving circuit 12B and the light emitting element driving IC constituting a part of the driving circuit 12C).

In addition, the communication unit 15 receives the notification signals, which are transmitted from the external terminals T14 of the other light emitting element driving ICs (the light emitting element driving IC constituting a part of the driving circuit 12B and the light emitting element driving IC constituting a part of the driving circuit 12C), and are input to the external terminal T14 of the light emitting element driving IC 13.

If the OR gate 14E outputs the low level signal and the communication unit 15 does not receive the notification signal, the control unit 3 generates the PWM signal having the on-duty corresponding to the resistance value of the resistor R1 connected to the external terminal T7. On the other hand, if the OR gate 14E outputs the low level signal and the communication unit 15 receives the notification signal, the control unit 3 generates the PWM signal having the on-duty corresponding to the resistance value of the resistor R2 connected to the external terminal T8. The on-duty corresponding to the resistance value of the resistor R2 is set to a larger value than the on-duty corresponding to the resistance value of the resistor R1. In addition, If the OR gate 14E outputs the high level signal, the control unit 3 set the on-duty of the PWM signal to 0% so as to stop the switching control.

Further, when the OR gate 14E outputs the high level signal, the control unit 3 outputs the abnormality notification signal S1 indicating that there is an unlighted light emitting diode to the external terminal T13.

According to the light emitting device illustrated in FIG. 3 described above, if luminance of the light emitting diode in one of the three systems decreases because of a decrease in the number of lighted light emitting diodes in the one system, current flowing in the light emitting diodes in the remaining two systems is increased based on the PWM signal having a larger on-duty than usual. In this way, even if luminance of the light emitting diode is decreased in one system, insufficient luminance can be prevented.

In addition, in the light emitting device illustrated in FIG. 3, because insufficient luminance can be prevented even if luminance of the light emitting diode is decreased in one system, the user hardly notices that luminance of the light emitting diode is decreased in one system due to a decrease in the number of lighted light emitting diodes in the one system. However, when luminance of the light emitting diode is decreased in one system due to a decrease in the number of lighted light emitting diodes in the one system, the light emitting device illustrated in FIG. 3 outputs the abnormality notification signal S1 externally from the external terminal T13 of the light emitting element driving IC in the one system, and hence it is possible to readily urge the user to have the light emitting device illustrated in FIG. 3 repaired, by using the abnormality notification signal S1.

In addition, it is possible to modify this structural example too, in the same manner as the variation of the first structural example described above.

Third Structural Example

Figure 4:
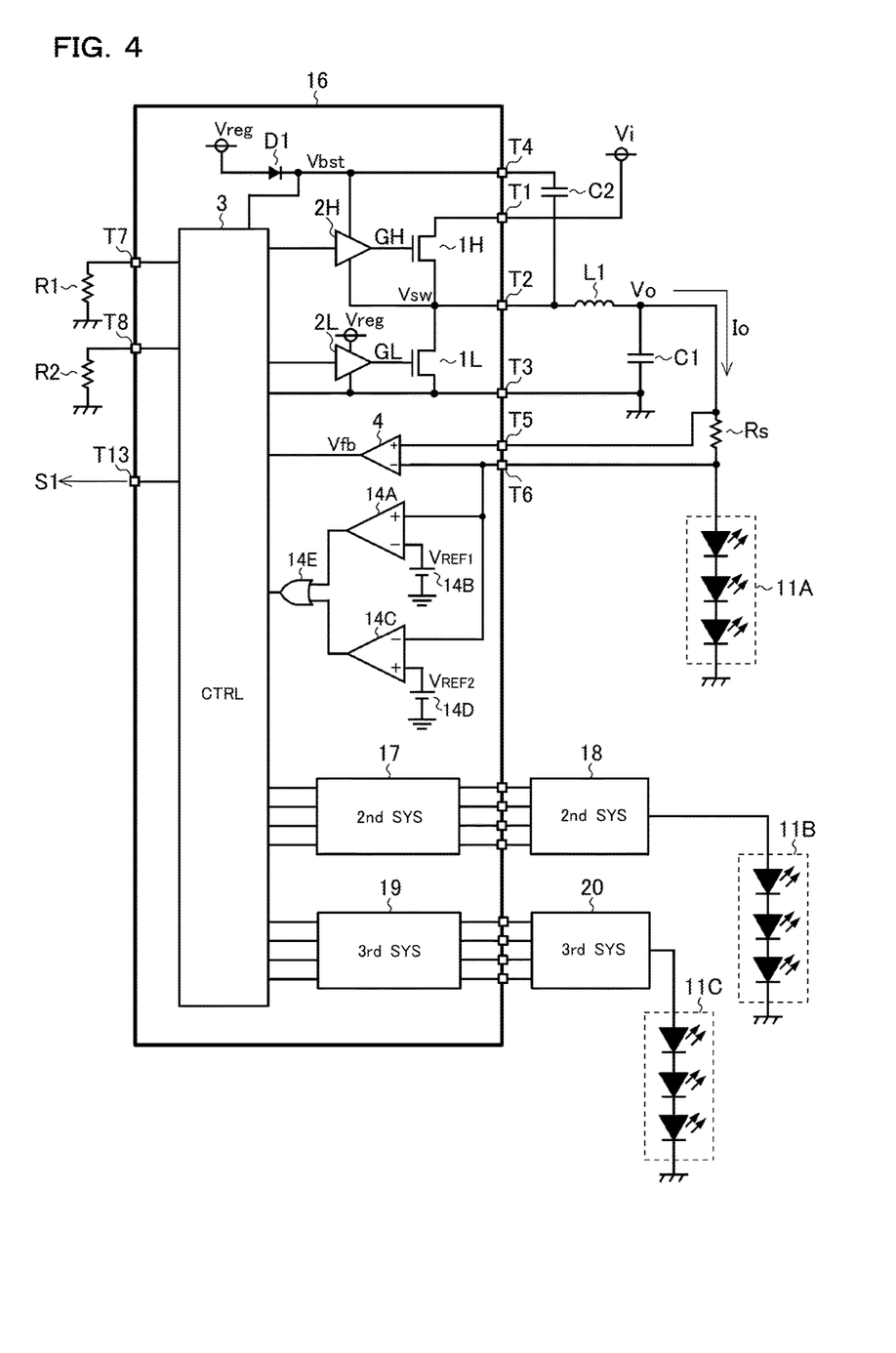
FIG. 4 is a diagram illustrating a third structural example of the light emitting device.

FIG. 4 is a diagram illustrating a third structural example of the light emitting device. The light emitting device illustrated in FIG. 4 has a structure in which the three light emitting element driving ICs disposed respectively for the three systems in the light emitting device illustrated in FIG. 3 are combined into one light emitting element driving IC 16. In other words, the light emitting element driving IC 16 includes a second system circuit 17 and a third system circuit 19, and second system external components 18 and third system external components 20 are externally connected to the light emitting element driving IC 16. The communication unit 15 used in the light emitting device illustrated in FIG. 3 is eliminated because it is not necessary to communicate among the light emitting element driving ICs in the light emitting device illustrated in FIG. 4.

The external terminal of the light emitting element driving IC 16 connected to the application terminal of the input voltage Vi, the external terminal of the light emitting element driving IC 16 connected to the ground terminal, and the like can be shared by the first to third systems, and hence it is preferred to share them.

Control of the output currents Io of the first to third systems in the light emitting device illustrated in FIG. 4 is basically the same as the control of the output currents Io of the first to third systems in the light emitting device illustrated in FIG. 3, and hence detailed description thereof is omitted. The light emitting device illustrated in FIG. 4 achieves the same effect as the light emitting device illustrated in FIG. 3.

<Application>

Figure 5:
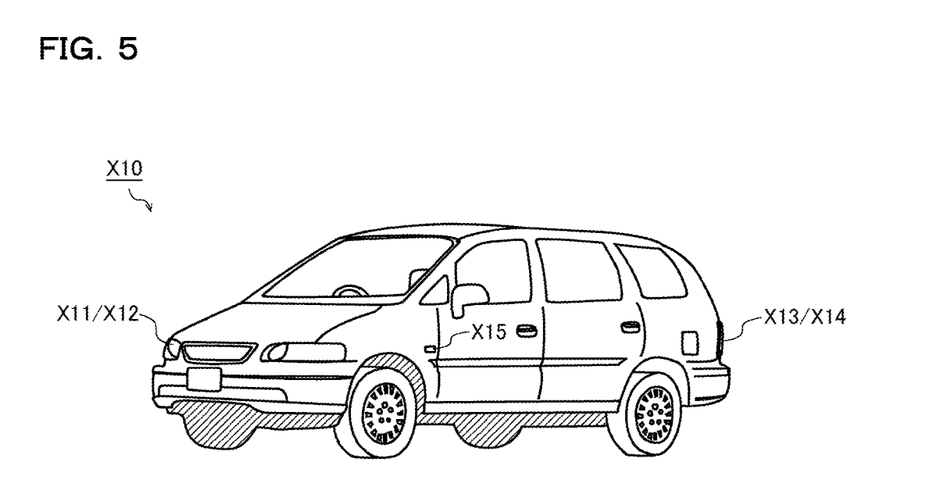
FIG. 5 is an external view (front) of a vehicle equipped with the light emitting device.
Figure 6:
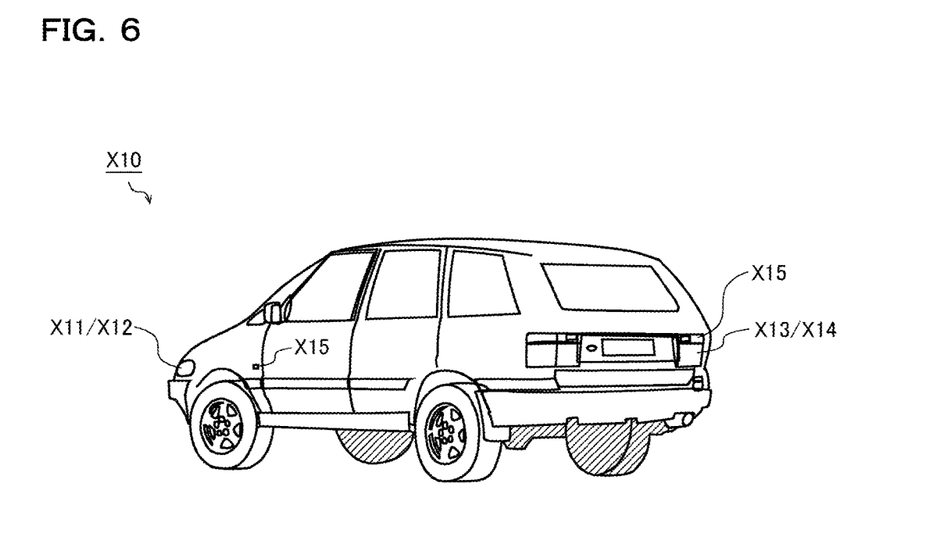
FIG. 6 is an external view (rear) of the vehicle equipped with the light emitting device.

The light emitting device described above can be used appropriately as illustrated in FIGS. 5 and 6, for example, as a headlight of a vehicle X10 (appropriately including a high beam, a low beam, a small lamp, a fog lamp, or the like) X11, a day and night running (DRL) light source X12, a tail lamp (appropriately including a small lamp, a back lamp, or the like) X13, a stop lamp X14, a turn lamp X15, or the like.

Figure 7:
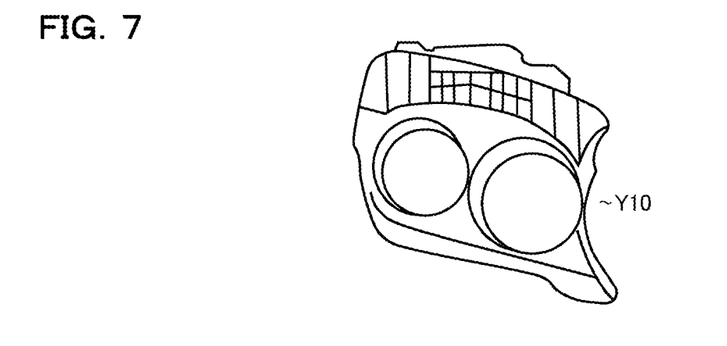
FIG. 7 is an external view of an LED head light module.
Figure 8:
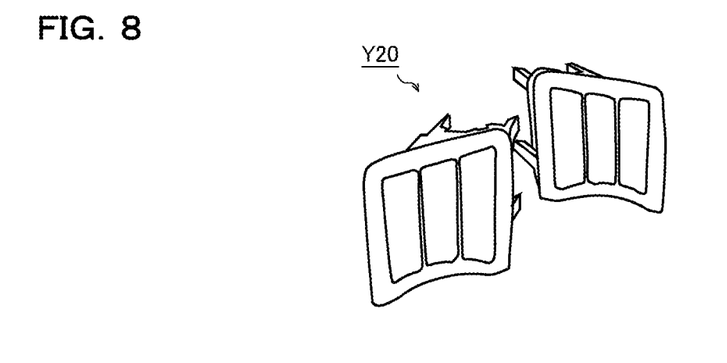
FIG. 8 is an external view of an LED turn lamp module.
Figure 9:
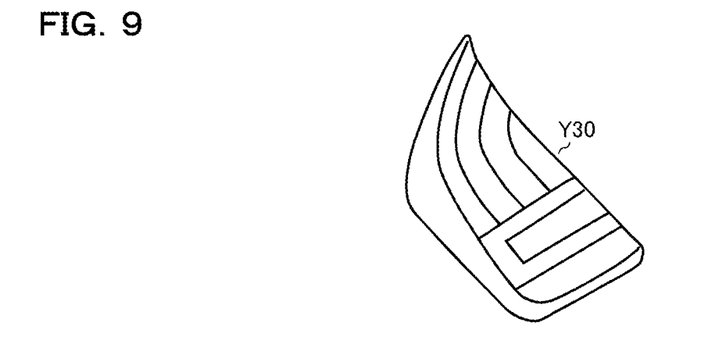
FIG. 9 is an external view of an LED rear lamp module.

Note that the light emitting device described above may be provided as a module (such as an LED head light module Y10 of FIG. 7, an LED turn lamp module Y20 of FIG. 8, or an LED rear lamp module Y30 of FIG. 9). In addition, it may be provided as a driving device having a function of controlling the number of light emitting elements, which is a semifinished product in which the light emitting diode and the external components of the light emitting element driving IC are eliminated from the light emitting device described above.

In addition, the light emitting device described above can be used as a backlight of a display device, for example.

<Other Variations>

Note that the embodiment described above exemplifies the structure in which the light emitting diode is used as the light emitting element, but the present invention is not limited to this structure. For example, it is possible to use an organic electro-luminescence (EL) element as the light emitting element.

In addition, other than the embodiment described above, various technical features disclosed in this specification can be variously modified within the scope without deviating from the spirit of the technical invention. For example, the embodiment described above uses the switching regulator as the light emitting element driving device that drives the light emitting element, which performs switching control of the power elements (the upper transistor 1H and the lower transistor 1L) so that the output current Io coincides with the target value. However, it is possible to use a linear regulator instead of the switching regulator, which controls on resistance of the power element so as to coincide with a target value. In addition, it is possible to implement a combination of the first structural example and the second structural example, for example. Similarly, it is possible to implement a combination of the first structural example and the third structural example. In other words, the embodiment described above is merely an example in every aspect and should not be interpreted as a limitation. The technical scope of the present invention is defined not by the above description of the embodiment but by the claims, and should be understood to include all modifications within meaning and scope equivalent to the claims.

SUMMARY

The light emitting element driving semiconductor integrated circuit of the first structure described above, which constitutes at least a part of a light emitting element driving device arranged to drive a series connection unit including a plurality of light emitting elements, includes a single-element short-circuit detection unit arranged to detect that one of the plurality of light emitting elements is short-circuited, and a control unit arranged to control a power element of the light emitting element driving device so that current supplied from the light emitting element driving device to the series connection unit is increased, when the single-element short-circuit detection unit detects that one of the plurality of light emitting elements is short-circuited.

The light emitting element driving semiconductor integrated circuit of the second structure described above, which constitutes at least a part of a light emitting element driving device arranged to drive at least one light emitting element, includes a determining unit arranged to determine whether or not luminance of the at least one light emitting element is decreased due to a decrease in the number of lighted elements in the at least one light emitting element, a transmitting unit arranged to transmit a notification signal to another light emitting element driving semiconductor integrated circuit, when the determining unit determines that luminance of the at least one light emitting element is decreased due to a decrease in the number of lighted elements in the at least one light emitting element, a receiving unit arranged to receive another notification signal transmitted from another light emitting element driving semiconductor integrated circuit, and a control unit arranged to control a power element of the light emitting element driving device. When the determining unit determines that luminance of the at least one light emitting element is decreased due to a decrease in the number of lighted elements in the at least one light emitting element, the control unit controls the power element to stop current supply from the light emitting element driving device to the at least one light emitting element. When the receiving unit receives the another notification signal, the control unit controls the power element so that current supplied from the light emitting element driving device to the at least one light emitting element is increased.

The light emitting element driving semiconductor integrated circuit of the third structure described above, which constitutes at least a part of a light emitting element driving device arranged to supply respective currents to a plurality of systems each including at least one light emitting element, includes a determining unit arranged to determine whether or not luminance of one system is decreased due to a decrease in the number of lighted elements in the one system, and a control unit arranged to control a plurality of power elements of the light emitting element driving device. When the determining unit determines that luminance of the one system is decreased due to a decrease in the number of lighted elements in the one system, the control unit controls the power element corresponding to the one system to stop current supply from the light emitting element driving device to the one system, and controls at least one power element corresponding to a system other than the one system so that current supplied from the light emitting element driving device to the system other than the one system is increased.

In addition, the light emitting element driving semiconductor integrated circuit having one of the first to third structures may further include an external output unit arranged to externally output an abnormality notification signal indicating that there is an unlighted light emitting element, when the single-element short-circuit detection unit detects that one of the plurality of light emitting elements is short-circuited, or when the determining unit determines that luminance of the at least one light emitting element is decreased due to a decrease in the number of lighted elements in the at least one light emitting element, or when the determining unit determines that luminance of the one system is decreased due to a decrease in the number of lighted elements in the one system (fourth structure).

The light emitting element driving device having the fifth structure described above, which drives a series connection unit including a plurality of light emitting elements, includes a power element, a single-element short-circuit detection unit arranged to detect that one of the plurality of light emitting elements is short-circuited, and a control unit arranged to control the power element so that current supplied from the light emitting element driving device to the series connection unit is increased, when the single-element short-circuit detection unit detects that one of the plurality of light emitting elements is short-circuited.

The light emitting element driving device of the sixth structure described above, which supplies respective currents to a plurality of systems each including at least one light emitting element, includes a plurality of power elements, a determining unit arranged to determine whether or not luminance of one system is decreased due to a decrease in the number of lighted elements in the one system, and a control unit arranged to control the plurality of power elements. When the determining unit determines that luminance of the one system is decreased due to a decrease in the number of lighted elements in the one system, the control unit controls the power element corresponding to the one system to stop current supply from the light emitting element driving device to the one system, and controls at least one power element corresponding to a system other than the one system so that current supplied from the light emitting element driving device to the system other than the one system is increased.

In addition, the light emitting element driving device having the fifth or sixth structure described above may further include an external output unit arranged to externally output an abnormality notification signal indicating that there is an unlighted light emitting element, when the single-element short-circuit detection unit detects that one of the plurality of light emitting elements is short-circuited, or when the determining unit determines that luminance of the one system is decreased due to a decrease in the number of lighted elements in the one system (seventh structure).

The light emitting device described above includes a plurality of light emitting elements, and the light emitting element driving device having any one of the fifth to seventh structures arranged to drive the plurality of light emitting elements (eighth structure).

In addition, in the light emitting device having the eighth structure described above, the light emitting element may be a light emitting diode or an organic EL element (ninth structure).

In addition, in the light emitting device having the eighth or ninth structure described above, the light emitting device may be used as an in-vehicle lamp (tenth structure).

In addition, in the light emitting device having the tenth structure described above, the light emitting device may be mounted in a vehicle as a headlight module, a turn lamp module, or a rear lamp module (eleventh structure).

The vehicle described above includes the light emitting device having the tenth or eleventh structure described above (twelfth structure).

In addition, in the vehicle having the twelfth structure, the light emitting device may be used as at least one of a headlight, a day and night running light source, a tail lamp, a stop lamp, and a turn lamp (thirteenth structure).

What is claimed is:

1. A light emitting element driving semiconductor integrated circuit constituting at least a part of a light emitting element driving device arranged to drive a series connection unit including a plurality of light emitting elements, the circuit comprising:
    a power element;
    a plurality of single-element short-circuit detection units; and
    a control unit arranged to control the power element to supply current to the series connection unit of the light emitting elements,
    wherein the plurality of single-element short-circuit detection units are connected in parallel with the plurality of light emitting elements respectively, each of the plurality of single-element short-circuit detection units detecting that a corresponding one of the plurality of light emitting elements is short-circuited, and
    wherein the control unit is arranged to control the power element so that current supplied from the light emitting element driving device to the series connection unit is increased when at least one of the plurality of single-element short-circuit detection units detects a short circuit.

2. The light emitting element driving semiconductor integrated circuit according to claim 1, further comprising an external output unit arranged to externally output an abnormality notification signal indicating that there is an unlighted light emitting element, when the single-element short-circuit detection unit detects that one of the plurality of light emitting elements is short-circuited.

3. The light emitting element driving device comprising the light emitting element driving semiconductor integrated circuit according to claim 1, wherein the power element, the single-element short-circuit detection unit, and the control unit are disposed inside or outside the light emitting element driving semiconductor integrated circuit.

4. The light emitting element driving device according to claim 3, comprising, inside or outside the light emitting element driving semiconductor integrated circuit, an external output unit arranged to externally output an abnormality notification signal indicating that there is an unlighted light emitting element, when the single-element short-circuit detection unit detects that one of the plurality of light emitting elements is short-circuited.

5. A light emitting device comprising:
    a plurality of light emitting element; and
    the light emitting element driving device according to claim 3 arranged to drive the plurality of light emitting elements.

6. The light emitting device according to claim 5, wherein the light emitting element is a light emitting diode or an organic EL element.

7. The light emitting device according to claim 5, wherein the light emitting device is used as an in-vehicle lamp.

8. The light emitting device according to claim 7, wherein the light emitting device is mounted in a vehicle as a headlight module, a turn lamp module, or a rear lamp module.

9. A vehicle comprising the light emitting device according to claim 7.

10. The vehicle according to claim 9, wherein the light emitting device is used as at least one of a headlight, a day and night running light source, a tail lamp, a stop lamp, and a turn lamp.

11. The light emitting element driving semiconductor integrated circuit according to claim 1, further comprising:
    a first terminal arranged to be connectable to a first resistor; and
    a second terminal arranged to be connectable to a second resistor different from the first resistor,
    wherein the control unit is arranged to generate a PWM signal, and to perform switching control of the power element during an on period of the PWM signal, and
    wherein the control unit is arranged to set an on duty of the PWM signal
        at a value corresponding to a resistance value of the first resistor when none of the plurality of single-element short-circuit detection units detects a short circuit and
        at a value corresponding to a resistance value of the second resistor when one of the plurality of single-element short-circuit detection units detects a short circuit.

12. The light emitting element driving semiconductor integrated circuit according to claim 1, further comprising:
    a first terminal arranged to be connectable to a first resistor; and a second terminal arranged to be connectable to a second resistor different from the first resistor, wherein the control unit is arranged to set a target value of the current supplied from the light emitting element driving device to the series connection unit, and wherein the control unit is arranged to set the target value
- at a value corresponding to a resistance value of the first resistor when none of the plurality of single-element short-circuit detection units detects a short circuit and
- at a value corresponding to a resistance value of the second resistor when one of the plurality of single-element short-circuit detection units detects a short circuit.

13. The light emitting element driving semiconductor integrated circuit according to claim 1, further comprising a plurality of common terminals, wherein the common terminals are each connected to two of the single-element short-circuit detection units, and wherein a number of the plurality of common terminals is smaller by one than a number of the plurality of single-element short-circuit detection units.

\* \* \* \* \*